United States Patent [19]

Heeren

[11] 4,065,679

[45] Dec. 27, 1977

[54] DYNAMIC LOGIC SYSTEM

[75] Inventor: Richard H. Heeren, Chicago, Ill.

[73] Assignee: Teletype Corporation, Skokie, Ill.

[21] Appl. No.: 822,520

[22] Filed: May 7, 1969

[51] Int. Cl.² .................. H03K 17/60; H03K 19/08; H03K 19/20; H03K 19/40
[52] U.S. Cl. .................................. 307/251; 307/205
[58] Field of Search ............... 307/205, 251, 279, 304

[56] References Cited

U.S. PATENT DOCUMENTS

| | | | |
|---|---|---|---|
| 3,322,974 | 5/1967 | Ahrons et al. | 307/304 X |
| 3,457,435 | 7/1969 | Burns et al. | 307/205 X |
| 3,502,908 | 3/1970 | Christensen | 307/205 X |
| 3,517,210 | 3/1968 | Rubinstein | 307/205 |
| 3,524,077 | 8/1970 | Kaufman | 307/251 X |
| 3,564,300 | 2/1971 | Henle | 307/304 X |
| 3,582,674 | 6/1971 | Pound | 307/208 X |

OTHER PUBLICATIONS

Atwood, "Field Effect Transistor Circuits", IBM Tech. Discl. Bull.; vol. 6, No. 9; 2/1964; pp. 91–92.
General Instrument Corp. Publication No. MEM 3064; "MTOS Integrated Circuit"; 6/1967; 4 pgs.
Fairchild Semiconductor Division, Pub. No. 3320 (Fairchild Camera & Instrument Corp.); 4 pgs; 1968.

Primary Examiner—John S. Heyman
Assistant Examiner—Larry N. Anagnos
Attorney, Agent, or Firm—W. G. Dosse; J. C. Albrecht

[57] ABSTRACT

A dynamic logic system is disclosed in which a capacitor is charged by a clock signal through a gating device. The capacitor is either discharged or remains at its charged value in response to the impedance of a logic circuit. Two such systems are disclosed in which the output from the first logic system is applied as an input to the second logic system.

2 Claims, 4 Drawing Figures

INVENTOR
RICHARD H. HEEREN
BY J. L. Landis
ATTORNEY

DYNAMIC LOGIC SYSTEM

FIELD OF THE INVENTION

This invention relates to a dynamically clocked logic system and particularly to a dynamically clocked MOSFET intergrated logic system.

BACKGROUND OF THE INVENTION

Digital circuitry has played an important role in the growth of electronic industries. As the cost of equipment for performing digital operations is reduced, digital circuits replace more and more analog circuits and find new applications previously not contemplated.

Developments enabling the fabrication of large scale integrated logic circuit arrays have reduced the potential cost of digital equipment. Thousands of devices can be created on a semiconductor substrate which previously was employed for one device. As the size of semiconductor devices is reduced and their packing density is thereby increased, the electrical and thermal parameters which affect the design of such circuitry are altered. For example, as the size of a MOSFET is reduced, the minimum obtainable source-to-drain impedance is increased. As components are placed more closely together, stray capacity is reduced and average allowable power dissipation for each device is reduced. Further, because of the compact arrangement, bringing excess leads to the circuitry increases the complexity thereof.

New circuit configurations have been developed to take these new parameters into account, providing circuits more suitable for large scale integration. A straightforward appraoch to implementing logical functions in MOSFET integrated circuits involves a logic network including a plurality of FET devices to provide either an open or short circuit depending upon the logical state thereof in series with an FET load device. The series circuit is connected between two reference voltage levels. A gating FET device connects the junction of the logic network and the load FET to drive another logic stage or a load device, either of which may be a capacitor. The gating FET is periodically enabled to transfer the logical level at the junction of the load FET and the logic network to the capacitor.

This configuration suffers from several disadvantages. The soure-to-drain impedance of the load FET must bear a known relationship to the impedance of the logic network in its ON and OFF states. This places a constraint on the parameters of the FET devices used therein lowering the yield, since each device must have parameters within a limited range. Further, when the logic network is in its ON state, current is continuously flowing in the load device and the logic network, therefore dissipating power. Also, all devices cannot be minimum size devices due to the impedance relationships and therefore layout efficiency is sacrificed. Finally, two power supply leads must be brought to the circuit decreasing layout efficiency.

U.S. Pat. No. 3,365,707 entitled "LSI Array and Standard Cells," which issued to T. R. Mayhew on Jan. 23, 1968, discloses a dynamically clocked logic circuit in which a logic circuit as above described is modified by gating the load FET as well as the gating FET. In this arrangement current flows only during the gating process. Therefore, the power dissipation in the circit is reduced. Standby current still flows, however, during gating and the other disadvantages still remain.

Another type of logic circuit employing large scale integrated circuits includes a gated load transistor in series with a second gating transistor also in series with a logic network. The series chain is connected between two voltage levels. The gated load transistor is pulsed to charge an output capacitor. After the output capacitor is charged, the load transistor is turned OFF and the second gating transistor is pulsed to discharge the capacitor if the logic network provides a short. In this way, an open circuit logic network leaves th voltage on the capacitor while the shorted logic circuit discharges it. In this circuit, no standing current is required, minimizing the power dissipated in performing logic functions. The impedance values of the various FET devices may vary over a wide range without affecting circuit operation. This arrangement, however, still requires two FET's in addition to the logic network. Power supply leads must still be brought to the circuit. This circuit also requires two clocking pulses as opposed to one for each stage of logic.

SUMMARY OF THE INVENTION

In accordance with the present invention a logic circuit is wired in parallel with a gating device forming a two node parallel circuit. One node of the parallel circuit is connected to a capacitor. A clock signal varying between first and second voltage levels is applied to the other node of the parallel circuit. When the clock signal is at its first voltage level, the gating device charges the capacitor therethrough to the first voltage level. When the clock signal assumes the second voltage level the gating device is turned off, providing a high impedance in parallel with the logic circuit. If the logic circuit is in a state providing a high impedance, the capacitor remains charged to the first voltage level. If the logic circuit is in a state offering a low impedance, the capacitor is discharged to the second voltage level. In this way, impedance states of a logic circuit are converted to a digital voltage signal without requiring standing current or power supply leads. All devices may be minimum size devices since no impedance relationship must be maintained. Only one additional gating device is needed over and beyond the logic circuit. Only one clock signal is necessary for one stage of logic. All these characteristics contribute to a large increase in layout efficiency.

In one embodiment, a gated phase splitting function is performed by a parallel logic circuit which includes a field effect transistor serving as a first gating device and driving a first capacitor. The source-to-drain impedance of the field effect transistor serves as the logic circuit impedance in the two node parallel circuit. A second gating device having a control terminal driven by the clock signal has a controlled terminal connected to a second capacitor. This controlled terminal is also connected to the gate of the field effect transistor. An information signal is applied to another controlled terminal of the gating device. When the clock signal is at its first value, the first capacitor is charged to the first value and the second capacitor to the value of the information signal. When the clock signal is switched to its second value, the signal stored on the second capacitor drives the field effect transistor to the impedance value which will result in the first capacitor having a complementing level to the second capacitor.

DETAILED DESCRIPTION

Figure 1:
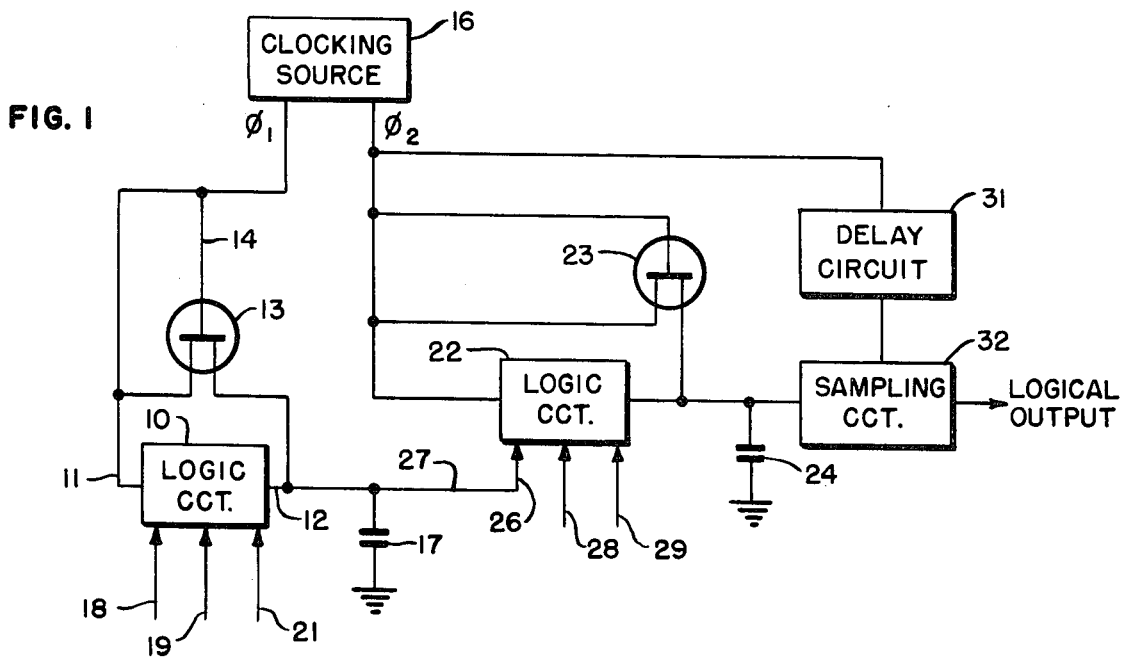
FIG. 1 is a diagram of a logic system embodying the principles of this invention.

A dynamically clocked logic system, shown in FIG. 1, includes a logic circuit 10 exhibiting an impedance between terminals 11 and 12 connected in parallel with the source-to-drain impedance of a P-channel, enhancement mode field effect transistor 13. The gate 14 of the field effect transistor 13 is connected to the terminal 11 of the logic circuit 10. A clocking signal $\phi_1$ provided by a clocking source 16 is applied to the terminal 11 of the logic circuit 10. The terminal 12 of the logic circuit 10 is connected to one electrode of a capacitor 17, the other electrode of which is returned to ground.

The logic circuit 10 is responsive to digital logic signals applied to logic input terminals 18, 19 and 21 for varying the impedance between terminals 11 and 12. For example, three field effect transistors may have their source-to-drain impedances placed in series between terminals 11 and 12 with their gates connected to terminals 18, 19 and 21, respectively, to provide a three-input NAND gate. It should be understood that any logic circuit exhibiting an impedance between terminals, such as terminals 11 and 12, may be employed in a system of this invention. The number of logic inputs is dependent upon the logic function to be performed.

A second logic circuit 22 associated with field effect transistor 23 and capacitor 24 is driven by a clocking signal $\phi_2$ from the clocking source 16. A lead 27 connects the output of logic circuit 10 which appears across capacitor 17 to logic input terminal 26. Logic circuit 22 has two additional logic input terminals 28 and 29.

Figure 2:
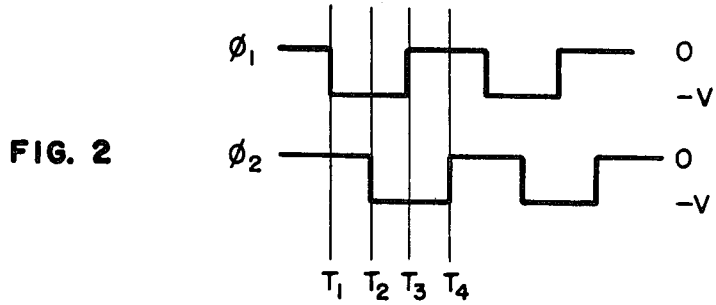
FIG. 2 shows the clocking waveforms generated by a clocking source in the system of FIG. 1.

At time $t_1$ the clocking signal $\phi_1$, see FIG. 2, switches from ground to a negative potential $-V$ applying a negative signal across the logic circuit 10, the field effect transistor 13 and the gate 14 thereof. The negative signal on the gate 14 of P-channel field effect transistor 13 switches the source-to-drain impedance of the field effect transistor 13 from its OFF condition in which it exhibits an impedance in the neighborhood of $10^{11}$ ohms to its ON condition in which it exhibits an impedance typically of $5 \times 10^4$ ohms. The impedance exhibited between the terminals 11 and 12 of the logic circuit 10 may be either in a high or low impedance condition. The capacitor 17 is therefore charged through a source-to-drain impedance of the field effect transistor 13 in parallel with the impedance between terminals 11 and 12 of logic circuit 10 towards the negative potential $-V$. In an integrated circuit structure, the capacitor 17 may be a distributive capacity. It would typically be about $2 \times 10^{-12}$ farads.

At time $t_2$, the signal $\phi_2$, see FIG. 2, switches from ground to a negative potential $-V$ charging capacitor 24 towards the voltage $-V$ through the source-to-drain impedance of the field effect transistor 23 and the impedance of logic circuit 22 in a manner similar to the charging of capacitor 17. The timing of $t_1$ and $t_2$ when $\phi_1$ and $\phi_2$ go from ground to $-V$, thereby charging their respective capacitors 17 and 24, is not critical. They can occur in either order or simultaneously.

At time $t_3$, $\phi_1$ returns again to ground potential turning OFF field effect transistor 13 and bringing the source-to-drain impedance thereof back to its high impedance value. The impedance between terminals 11 and 12, dependent upon the logic signals applied to input terminals 18, 19, and 21 will be either in the high or low impedance condition. If logic circuit 10 is in the high impedance condition, the voltage $-V$ will be stored on capacitor 17 for a time dependent upon the time constant of the capacitor 17 and the parallel combination of the OFF impedance of the field effect transistor 13 and logic circuit 10. If, on the other hand, a low impedance condition exists between terminals 11 and 12, the capacitor 17 will be charged toward ground at a rate determined by the impedance of the logic circuit 10 and the capacitance of capacitor 17. Typically, the time constant with logic circuit 10 in its OFF condition will be one-tenth of a second, while the time constant with the logic circuit 10 in its ON condition will be one-tenth of a microsecond.

At time $t_4$, signal $\phi_2$ goes from $=V$ to ground turning OFF field effect transistor 23. The voltage stored on capacitor 17 appears on logic input terminal 26 of the logic circuit 22. This voltage together with signals applied to logic input terminals 28 and 29 determines the impedance condition of the logic circuit 22. If logic circuit 22 is in its high impedance condition, capacitor 24 will charge toward 0 volt with a time constant of approximatey one-tenth of a second, while if logic circuit 22 is in a low impedance condition, capacitor 24 will charge toward ground with a time constant of approximately one-tenth of a microsecond.

For proper circuit operation $t_4$ must occur after $t_3$, the time betwen $t_3$ and $t_4$ should be long compared with one-tenth of a microsecond and short compared with one-tenth of a second. It should be apparent from the time constants involved that the impedance range of the logic circuits 10 and 22 and of the source-to-drain impedance of the field effect transistors 13 and 23 may vary over a substantial range without affecting the circuit operation so long as sufficient time is allowed to elapse between $t_3$ and $t_4$. For example, with a time between $t_3$ and $t_4$ of 10 microseconds, either the ON or OFF impedance of any of the devices could be varied by an order of magnitude without affecting the circuit operation.

It should be noted that sequential stages or levels of logic are performed by the combination of the two logic circuits 10 and 22 without the use of a power supply. All power for circuit operation is extracted from the clock signals provided by clocking source 16. It should be further noted that no standing current flows in the circuit. The only current flowing is that required to charge and discharge the capacitors 17 and 24.

To provide a logic outut signal from capacitor 24 the clocking signal $\phi_2$ is delayed by delay circuit 31 approximately 10 microseconds to enable sampling circuit 32 to sample the capacitor 24 to determine the output condition thereof 10 microseconds after $t_4$.

While the gating devices have been shown as switched FETs, simple diodes could be employed to perform the gating function.

SECOND EMBODIMENT

Figure 3:
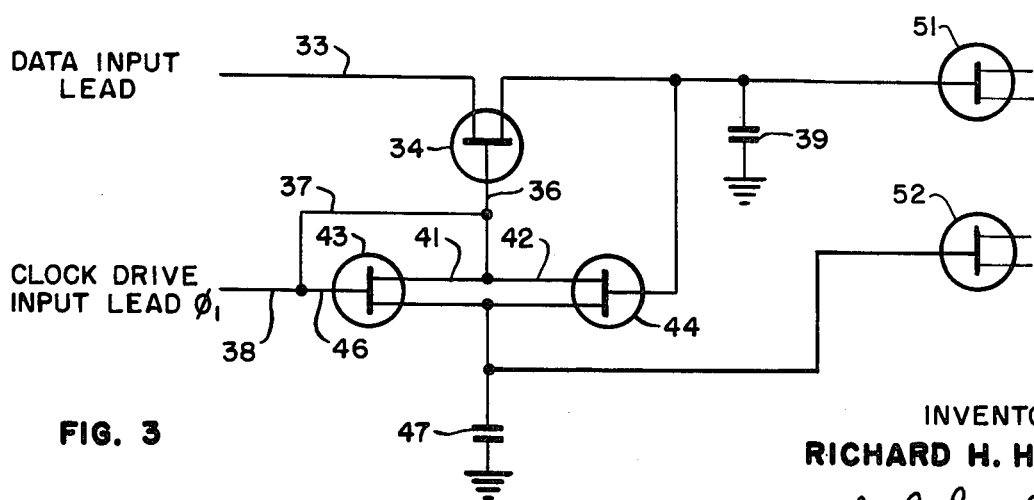
FIG. 3 is a circuit diagram of a gated inverter circuit built in accordance with the teachings of this invention.

A circuit for providing both a gated data signal and its complement built in accordance with the teaching of this invention is shown in FIG. 3. The data signal applied to a first electrode 33 of a field effect transistor 34 is periodically sampled by a clocking signal such as signal $\phi_1$. The signal $\phi_1$ is applied to the gate 36 of field effect transistor 34 by leads 37 and 38 to pass the information from the data signal to capacitor 39 when the signal $\phi_1$ goes negative. The signal $\phi_1$ is also applied to common electrodes 41 and 42 of parallel connected field effect transistors 43 and 44, respectively, and the gate 46 of field effect transistor 43. The field effect transistor 43 is thereby turned on when $\phi_1$ goes negative, charging capacitor 47 to the negative level thereof. When the clocking signal $\phi_1$ returns to ground, field effect transistor 43 is turned OFF. The state of field effect transistor 44 is controlled by the signal stored on capacitor 39. If a negative signal appears on capacitor 39, that negative signal is applied to the gate electrode of a field-effect transistor 51 and the field effect transistor 44 is turned ON discharging the capacitor 47 through field effect transistor 44 to the ground level of the signal $\phi_1$. If, on the other hand, a ground signal is present on the capacitor 39, the field effect transistor 44 remains in an OFF condition so that the negative signal remains on the capacitor 47 and that negative signal is applied to the gate electrode of a field-effect transistor 52. It is seen that in that way, the signal appearing on the capacitor 47 is always the complement of the signal on capacitor 39 a fixed time after the signal $\phi_1$ returns to ground. The field effect transistor 43 is analogous to the field effect transistor 13 or 23 in the circuit of FIG. 1. Capacitor 47 is analogous to the capacitor 17 or 24 and the field effect transistor 44, together with capacitor 39, is analogous to the logic circuits 10 and 22 in FIG. 1.

It is to be understood that the above-described arrangements are illustrative of the application of the principles of the invention. Numerous other arrangements may be devised by those skilled in the art without departing from the spirit and scope of the invention. While the dynamically clocked logic systems of this invention, including both the data reading circuit of FIG. 1 and the phase-splitting circuit of FIG. 3, have general applicability for use in various data-processing and logic systems, one particular application wherein both may be employed advantageously is disclosed in applicant's related copending application with C. R. Winston entitled "Read-Only Memory Arrays in which a Portion of the Memory Addressing Circuitry Is Integral to the Array," Ser. No. 822,521, filed on May 7, 1969.

In that application of the invention, the logic circuits such as 10 and 22 in FIG. 1 comprise single field effect transistors with their source-to-drain impedances connected between the logic circuit terminals such as 11 and 12, and their gates connectable in operation to input data signals, representative of the states of individual binary bits, or permutations of multiple bits. Additional logic circuits such as 10 and 22 may be connected in parallel with the ones shown in FIG. 1, being responsive to different inputs so that the capacitors such as 17 and 24 remain charged only if all of the parallel logic circuits are in the high-impedance state. With this arrangement, multiple data bits may be decoded to provide distinctive outputs on an array of capacitors such as 17 or 24 for various permutations of the data bits.

Since the phase-splitting circuit of FIG. 3 can be used in the read-only memory array of the abovementioned copending application, the field-effect transistors 51 and 52 can correspond to the field-effect transistors 46 and 41 of the decoding and accessing array 14 of the abovementioned copending application.

THIRD EMBODIMENT

Figure 4:
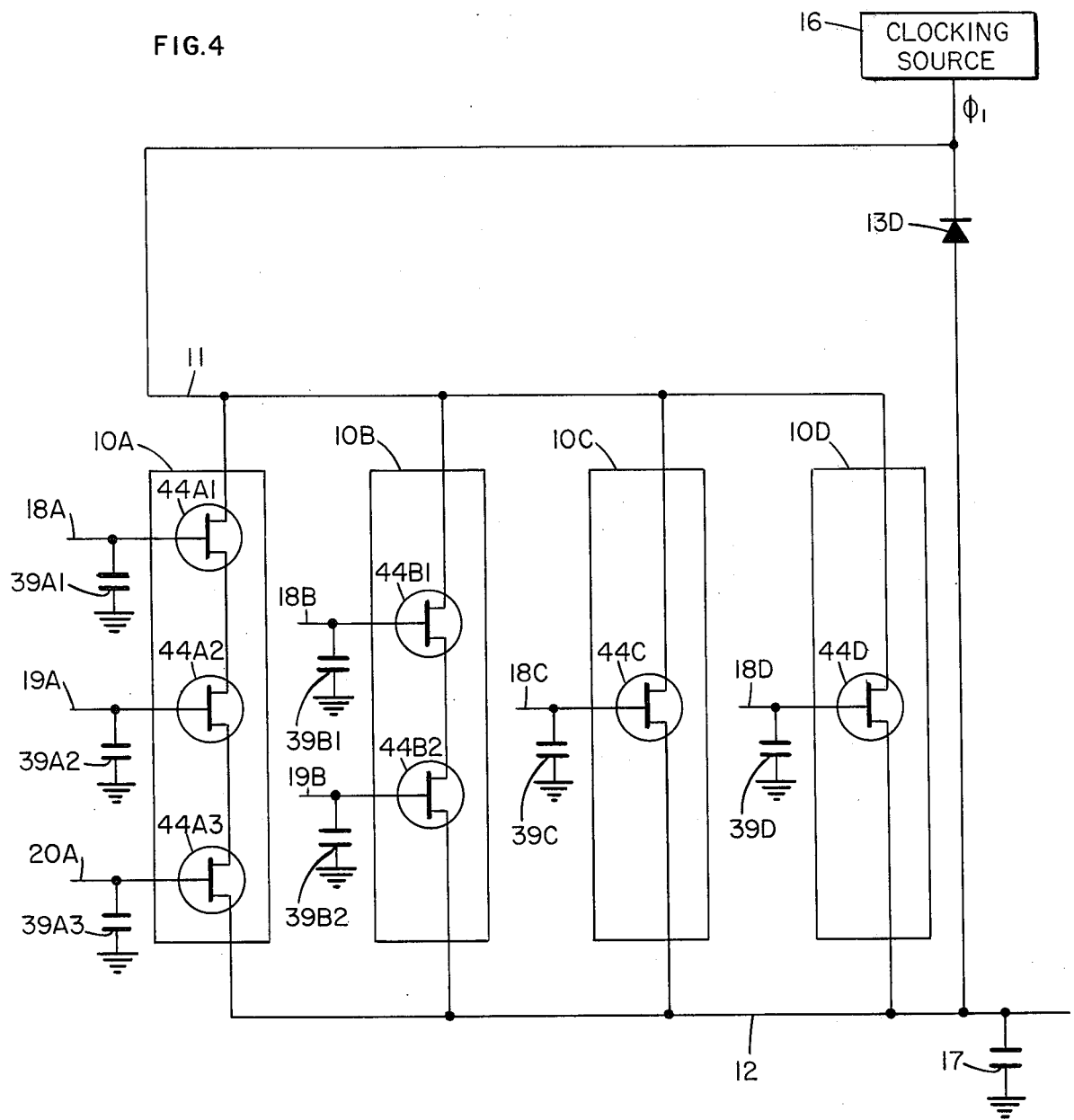
FIG. 4 is a circuit diagrram of a logic system as shown in FIG. 1 with the field-effect transistor 13 replaced by a diode 13d and with several logic circuits 10 shown with their internal connections of field-effect transistors.

Referring now to FIG. 4, there is shown a portion of the circuit of FIG. 1 with the field-effect transistor 13 replaced by a diode 13D which may be a semiconductor p-n junction diode, a Schottky or metal-to-semiconductor junction diode, or any other unidirectionally conductive device.

The logic circuit 10 of FIG. 1 has been shown in FIG. 4 as four logic circuits 10A, 10B, 10C, and 10D connected in parallel such that the capacitor 17 remains charged only if all of the parallel logic circuits are in the high-impedance state. The logic circuit 10A is shown with three field-effect transistors with their source-to-drain impedances placed in series between terminals 11 and 12 with their gates connected to three terminals 18A, 19A, and 20A. The logic circuit 10B is shown for simplicity with only two field-effect transistors 18B and 19B connected in series as in the logic circuit 10A. The logic circuits 10C and 10D have been shown as their analogous field-effect transistors 44C and 44D and capacitors 39C and 39D, as illustrated in connection with FIG. 3. These field-effect transistors are MOS p-channel, enhancement mode devices.

What is claimed is:

1. In combination;
   a field effect transistor having a source, a drain and gate for providing an impedance condition between said source and said drain;
   a first controlled switch having a first control terminal and first and second controlled terminals, said switch being responsive to a signal applied to said control terminal for altering the impedance between said first and second controlled terminals;
   means for connecting said source and drain to said first and second controlled terminals providing first and second nodes, respectively;
   a second controlled switch having a second control terminal and third and fourth controlled terminals;
   means for connecting said second control terminal to said first node;
   a first capacitor having first and second electrodes;
   means for connecting said second node to said second electrode;
   means for providing a clock signal between said first electrode and said first node;
   means for applying said clock signal to said first control terminal;
   means for applying an information signal to said third controlled terminal;
   a second capacitor connected between said first electrode of said first capacitor and said fourth controlled terminal; and
   means for connecting said fourth controlled terminal to said gate of said field effect transistor.

2. The combination as defined in claim 1, in which said first and second controlled switches are each field effect transistors.

* * * * *